(12) United States Patent
Nakai et al.

(10) Patent No.: US 8,339,834 B2
(45) Date of Patent: Dec. 25, 2012

(54) NON-VOLATILE SEMICONDUCTOR MEMORY DEVICE INCLUDING A VARIABLE RESISTANCE ELEMENT

(75) Inventors: Tsukasa Nakai, Tokyo (JP); Yasuhiro Nojiri, Mie (JP); Shuichi Kuboi, Mie (JP); Motoya Kishida, Kanagawa (JP); Akiko Nomachi, Kanagawa (JP); Masanobu Baba, Kanagawa (JP); Hiroyuki Fukumizu, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 192 days.

(21) Appl. No.: 12/882,822

(22) Filed: Sep. 15, 2010

(65) Prior Publication Data

US 2011/0205781 A1    Aug. 25, 2011

(30) Foreign Application Priority Data

Feb. 22, 2010    (JP) ................... 2010-036652

(51) Int. Cl.
*G11C 11/00* (2006.01)
*H01L 45/00* (2006.01)

(52) U.S. Cl. ............. 365/148; 257/2; 257/E45.001

(58) Field of Classification Search ............ 365/148
See application file for complete search history.

(56) References Cited

U.S. PATENT DOCUMENTS

| | | | | |
|---|---|---|---|---|
| 6,667,490 B2 * | 12/2003 | Van der Wagt et al. | ......... | 257/14 |
| 7,002,175 B1 * | 2/2006 | Singh et al. | ...................... | 257/25 |
| 7,220,983 B2 * | 5/2007 | Lung | ............................... | 257/4 |
| 7,531,840 B2 * | 5/2009 | Edmond et al. | ................ | 257/77 |
| 7,852,667 B2 * | 12/2010 | Lou | .............................. | 365/171 |
| 2008/0070162 A1 | 3/2008 | Ufert | | |
| 2010/0008123 A1 * | 1/2010 | Scheuerlein | ................. | 365/148 |

FOREIGN PATENT DOCUMENTS

| | | |
|---|---|---|
| JP | 2001-326336 | 11/2001 |
| JP | 2007-157776 | 6/2007 |
| JP | 2007-188977 | 7/2007 |
| JP | 2008-118108 | 5/2008 |
| JP | 2008-277827 | 11/2008 |
| JP | 2009-177115 | 8/2009 |

OTHER PUBLICATIONS

U.S. Appl. No. 12/825,975, filed Jun. 29, 2010, Tsukasa Nakai, et al.
U.S. Appl. No. 12/707,136, filed Feb. 17, 2010, Yasuhiro Satoh, et al.
P. Vettiger, et al., "The "Millipede"-Nanotechnology Entering Data Storage", IEEE Transactions on Nanotechnology, vol. 1, No. 1, Mar. 2002, pp. 39-55.
P. Vettiger, et al., "Thousands of Microcantilevers for Highly Parallel and Ultra-dense Data Storage", IEDM03, 2003, 4 pages.

* cited by examiner

*Primary Examiner* — Huan Hoang
*Assistant Examiner* — Tri Hoang
(74) *Attorney, Agent, or Firm* — Oblon, Spivak, McClelland, Maier & Neustadt, L.L.P.

(57) ABSTRACT

According to one embodiment, a non-volatile semiconductor memory device includes: a first line; a second line intersecting with the first line; and a memory cell arranged at a position where the second line intersects with the first line, wherein, the memory cell includes: a variable resistance element; and a negative resistance element connected in series to the variable resistance element.

20 Claims, 6 Drawing Sheets

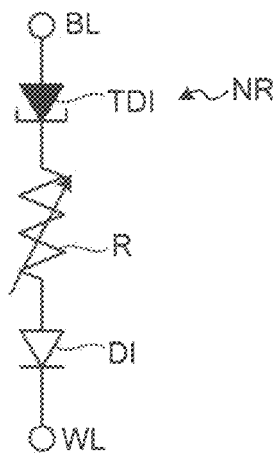
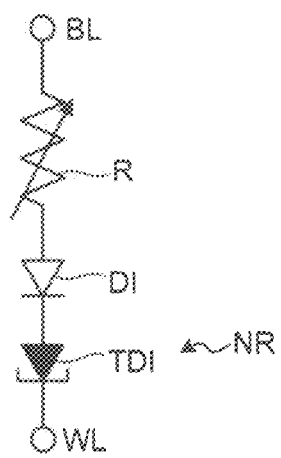
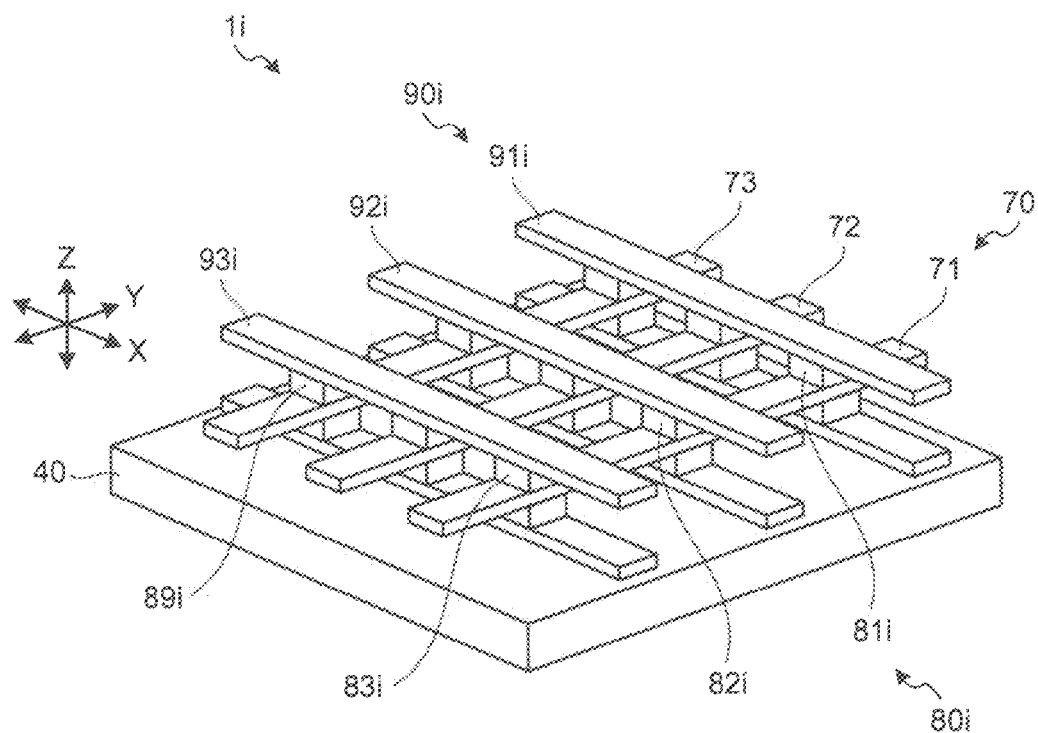

NON-VOLATILE SEMICONDUCTOR MEMORY DEVICE INCLUDING A VARIABLE RESISTANCE ELEMENT

CROSS-REFERENCE TO RELATED APPLICATIONS

This application is based upon and claims the benefit of priority from Japanese Patent Application No. 2010-036652, filed on Feb. 22, 2010; the entire contents of which are incorporated herein by reference.

FIELD

Embodiments described herein relate generally to a non-volatile semiconductor memory device.

BACKGROUND

Recently, a demand for compact information recording/reproducing devices (storage devices) having a large capacity has rapidly increased. Among the devices, NAND type flash memories and compact Hard Disk Drives (HDDs) have rapidly enhanced a recording density and formed a large market. Under the circumstances, several ideas of novel memories aiming at greatly exceeding a limit of a recording density have been proposed. Among the proposed ideas, attention is paid to a non-volatile semiconductor memory using a resistance change material having a low resistance state and a high resistance state.

In the non-volatile semiconductor memory, a low resistance state and a high resistance state can be repeatedly changed by applying a voltage pulse to a variable resistance element, and data is recorded as binary data "0" and "1" corresponding to the two states. It is expected that the non-volatile semiconductor memory can record data at multi levels by causing the variable resistance element to have plural level of low resistances or plural level of high resistances or the both. In addition, it is also expected that a recording density as well as a recording capacity of the non-volatile semiconductor memory are improved by shrinking the variable resistance element.

However, when shrinkage and multi-level storage of the variable resistance element is promoted, there is a possibility that the variable resistance element is partially broken by an unexpectedly large voltage and current applied to the variable resistance element when it is the forming, set, or reset. This partial breakdown of the variable resistance element can provide a tendency that a so-called probability of erroneous switching becomes high, the probability of erroneous switching being a probability that data is erroneously written or erased when the data is written to or erased from the variable resistance element. Further, that partial breakdown of the variable resistance element can also provide a disadvantage that the number of times of rewriting the element is restricted to a small number of times.

BRIEF DESCRIPTION OF THE DRAWINGS

FIGS. 4A and 4B are views showing a configuration of a non-volatile memory cell in a modification of the first embodiment;

FIG. 5 is a view showing the configuration of the non-volatile semiconductor memory device according to the modification of the first embodiment;

DETAILED DESCRIPTION

According to one embodiment, there is provided a non-volatile semiconductor memory device including a first line, a second line intersecting with the first line, and a memory cell arranged at a position where the second line intersects with the first line, and the memory cell includes a variable resistance element and a negative resistance element connected in series to the variable resistance element.

Non-volatile semiconductor memory devices according to exemplary embodiments of the invention will be explained below in detail referring to accompanying drawings. Note that the scope of the invention is by no means limited by these embodiments.

First Embodiment

Figure 1:
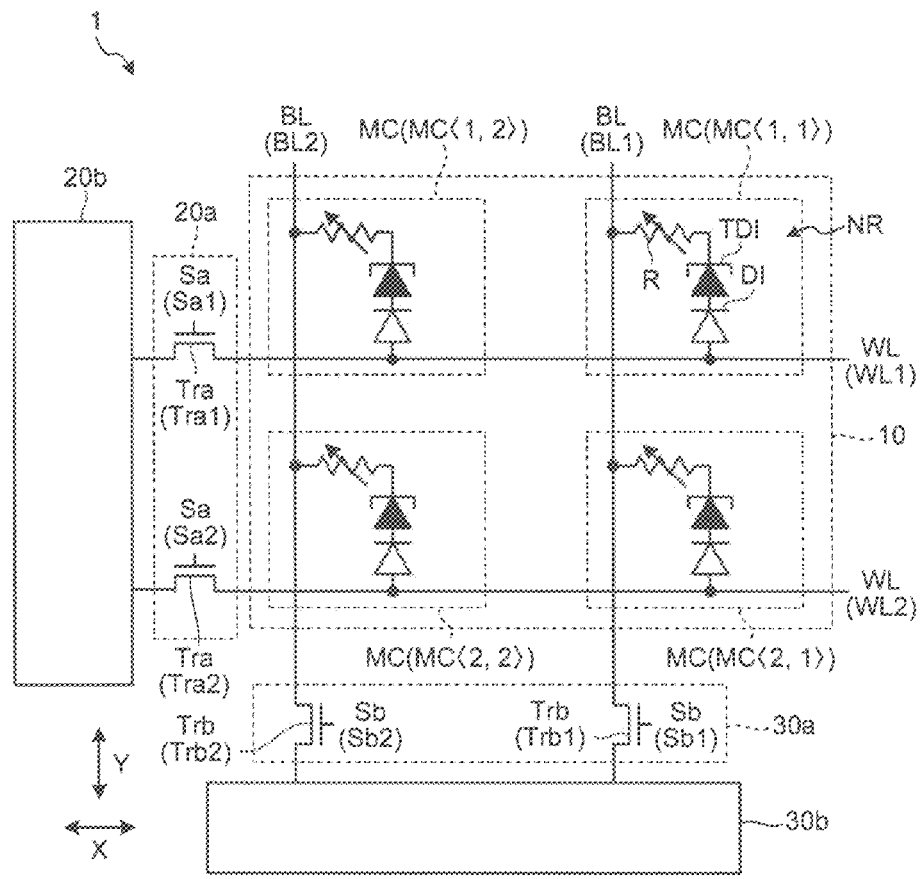
FIG. 1 is a view showing a configuration of a non-volatile semiconductor memory device according to a first embodiment.

A circuit configuration of a non-volatile semiconductor memory device 1 according to a first embodiment will be explained referring to FIG. 1. FIG. 1 is a view showing the circuit configuration of the non-volatile semiconductor memory device 1 according to the first embodiment.

As shown in FIG. 1, the non-volatile semiconductor memory device 1 includes plural word lines WL, plural bit lines BL, a memory cell array 10, a word line selection circuit 20a, a word line drive circuit 20b, a bit line selection circuit 30a, and a bit line drive circuit 30b.

Each of the plural word lines WL (WL1, WL2) extends along an X-direction. The plural word lines WL are arranged in a Y-direction at a predetermined pitch.

Each of the plural bit lines BL (BL1, BL2) extends along the Y-direction. The plural bit lines (plural first lines) BL intersect with the plural word lines (plural second lines) WL. The plural bit lines BL are arranged in the X-direction at a predetermined pitch.

In the memory cell array 10, plural non-volatile memory cells MC (MC<1, 1>-MC<2, 2>) are arranged at least in a matrix (in the X-direction and in the Y-direction). The plural non-volatile memory cells MC are arranged at positions (cross points) where the bit lines BL intersect with the word lines WL, respectively. More specifically, the memory cell array 10 is configured as a so-called cross point type memory.

Each of the non-volatile memory cells MC includes a diode DI, a variable resistance element R, and a negative resistance element NR. The diode DI, the variable resistance element R, and the negative resistance element NR are connected in series to each other in the non-volatile memory cell MC.

The diode DI is arranged so as to select the variable resistance element R connected thereto in series. More specifically, the diode DI is arranged to prevent a sneak current in record and reproduction. The diode DI has an anode connected to the word line WL and a cathode connected to the negative resistance element NR.

The variable resistance element R is electrically rewritable and performs a non-volatile data storage based on a resistance value. More specifically, the variable resistance element R can repeatedly change between a low resistance state and a high resistance state by being applied with voltage pulses from the word line drive circuit 20b and the word line selection circuit 20a. The variable resistance element R stores data by causing the two state to correspond to binary data "0" and "1". The variable resistance element R has one end connected to a bit line BL and the other end connected to a negative resistance element NR.

The negative resistance element NR restricts a current flowing to the variable resistance element R. More specifically, the negative resistance element NR is designed such that when a large voltage is applied to the variable resistance element R (for example, when the variable resistance element R is the forming or set), the negative resistance element NR operates in a negative resistance region NRR1 (refer to FIG. 7A). When the negative resistance element NR operates in the negative resistance region NRR1, the more a voltage applied to both ends of the negative resistance element NR become, the less a current flowing through the negative resistance element NR become. When, for example, a voltage is applied to the variable resistance element R to change the variable resistance element R from the high resistance state to the low resistance state, that is, when the variable resistance element R is the forming or set, the current flowing through the variable resistance element R transits from a relatively small state to a relatively large state.

Assuming each non-volatile memory cell does not have the negative resistance element NR or other element for restricting a current or some mechanisms for restricting a current, there is a possibility that a current flowing through the variable resistance element R becomes larger than necessary.

On the contrary, when the negative resistance element NR is arranged in each non-volatile memory cell, a voltage distributed to the variable resistance element R is reduced by an amount corresponding with a reduced amount of a resistance and a voltage distributed to the negative resistance element NR is increased inversely. More specifically, a state that a voltage is further applied to the negative resistance element NR is realized. At this time, when the element is designed so that an operating region (point) where such a voltage is applied to the negative resistance element NR becomes the negative resistance region NRR1, a current flowing through the variable resistance element R can be suppressed by the negative resistance element NR. As a result, since it is possible to keep a current larger than necessary from flowing through the variable resistance element R, a breakdown, a deterioration, and the like of the variable resistance element R caused by a large voltage and a current can be avoided.

Note that the negative resistance element NR performs also a role for protecting the variable resistance element R against an unexpected large voltage and current due to surge, various noises, an electrostatic charge, and the like in addition to a protection against a large voltage and current due to the switching (e.g. forming or setting) as described above.

The negative resistance element NR includes, for example, a tunnel diode TDI. As described above, the tunnel diode TDI operates to prevent application of an excessive voltage or current to the variable resistance element R as well as to protect the variable resistance element R. The tunnel diode TDI is connected to have the same polarity as the diode DI. More specifically, the tunnel diode TDI has an anode connected to the diode DI and a cathode connected to the variable resistance element R. The tunnel diode TDI is an element which exhibits a negative resistance when a voltage is applied in a forward direction. The tunnel diode TDI is, for example, a so-called Esaki diode.

A tentative case that each non-volatile memory cell MC does not have the negative resistance element NR will be examined here. In the case, there is a possibility that the variable resistance element R (a variable resistance layer 61i shown in FIG. 3A) in the non-volatile memory cell MC is partially broken by a large voltage and current applied thereto in forming and setting. This partial breakdown can provide a tendency that a so-called probability of erroneous switching becomes high, the probability of erroneous switching being a probability that data is erroneously written or erased when the data is written to or erased from the variable resistance element. Further, that partial breakdown of the variable resistance element can also provide a disadvantage that the number of times of rewriting the element is restricted to a small number of times.

Figure 7A:
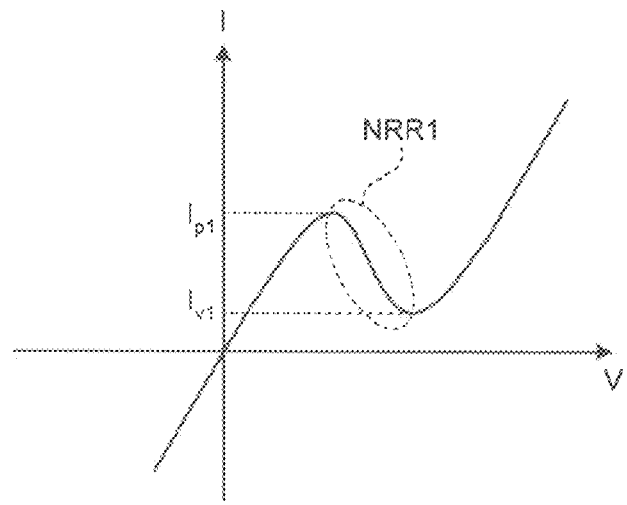
FIGS. 7A, 7B, and 7C are views showing properties of a negative resistance element in the first embodiment and the second embodiment.

In contrast, in the first embodiment, when a small voltage is applied to the variable resistance element R (for example, when the variable resistance element R is reset), the negative resistance element NR (tunnel diode TDI) operates as an element having a low resistance, and when a large voltage is applied to the variable resistance element R (when, for example, the variable resistance element R is the forming or set), the negative resistance element NR operates as a protection element for suppressing application of an unexpectedly large current and voltage to the variable resistance element R (when, for example, the variable resistance element R is the forming or set) (refer to FIG. 7A). With these functions, a current flowing through the variable resistance element R when a large voltage is applied to the variable resistance element R can be restricted while reducing an influence to the operation of the variable resistance element R when a small voltage is applied to the variable resistance element R. As a result, a (partial) breakdown of the variable resistance element R in the non-volatile memory cell MC can be suppressed while securing an appropriate operation of the variable resistance element R.

The word line selection circuit 20a includes plural selection transistors Tra (Tra1, Tra2). Each of the selection transistors Tra has a source and a drain one of which is connected to a word line WL and the other of which is connected to the word line drive circuit 20b. Signals Sa (Sa1, Sa2) are supplied to a gate of each selection transistor Tra. More specifically, any one of the plural word lines WL1, WL2 is selectively connected to the word line drive circuit 20b by selectively changing any of the plural signals Sa1, Sa2 to an active level and selectively turning on any of the plural selection transistors Tra1, Tra2.

The word line drive circuit 20b applies a predetermined voltage pulse to the word lines WL connected thereto via the word line selection circuit 20a. The predetermined voltage pulse is a voltage pulse which is necessary, for example, to erase data of the non-volatile memory cells MC, to write data to the non-volatile memory cells MC, and to read data from the non-volatile memory cells MC.

The bit line selection circuit 30a includes plural selection transistors Trb (Trb1, Trb2). Each of the selection transistors Trb has a source and a drain one of which is connected to a bit line BL and the other of which is connected to the bit line drive circuit 30b. Signals Sb (Sb1, Sb2) are supplied to a gate of each selection transistor Trb. More specifically, a bit line BL is selectively connected to the bit line drive circuit 30b by selectively changing any of the plural signals Sb1, Sb2 to an active level and selectively turning on any of plural selection transistors Trb1, Trb2.

The bit line drive circuit 30b applies a predetermined voltage pulse to the bit lines BL connected thereto via the bit line selection circuit 30a. The predetermined voltage pulse is a voltage pulse which is necessary, for example, to erase data of the non-volatile memory cells MC, to write data to the non-volatile memory cells MC, and to read data from the non-volatile memory cells MC. With the operation, an operation is performed to access the non-volatile memory cells connected to the bit lines BL and to erase data of, to write data to, and to read data from the non-volatile memory cells. Further, the bit line drive circuit 30b outputs the data read from the non-volatile memory cell MC via the bit lines BL to the outside.

Figure 2:
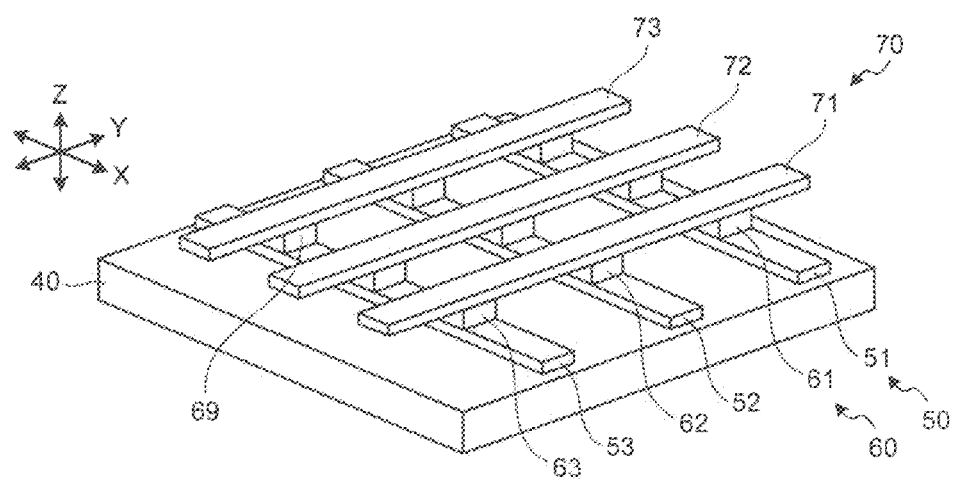
FIG. 2 is a view showing the configuration of the non-volatile semiconductor memory device according to the first embodiment.

A schematic layer configuration in the non-volatile semiconductor memory device in the first embodiment will be explained referring to FIG. 2. FIG. 2 is a view showing an example of the schematic layer configuration in the non-volatile semiconductor memory device in the first embodiment.

The non-volatile semiconductor memory device 1 has a semiconductor substrate 40, a first conductive layer 50, a memory layer 60, and a second conductive layer 70.

The semiconductor substrate 40 is formed of a semiconductor such as silicon.

The first conductive layer 50 is arranged on the semiconductor substrate 40. The first conductive layer 50 is formed of a material, which is resistant to heat as well as has a low (electrical) resistance value, for example, a conductor such as metal and the like. The first conductive layer 50 is composed of, for example, tungsten (W), titanium (Ti), tantalum (Ta), and nitrides thereof, layered structures thereof, or the like.

The first conductive layer 50 includes plural line patterns 51 to 53. The respective line patterns 51 to 53 function as the word lines WL. The plural line patterns 51 to 53 are arranged in the Y-direction at a predetermined pitch. The respective line patterns 51 to 53 extend in the X-direction.

The memory layer 60 is interposed between the first conductive layer 50 and the second conductive layer 70. A configuration in the memory layer 60 will be described later.

The memory layer 60 includes plural memory cells 61 to 69. The respective memory cells 61 to 69 function as the non-volatile memory cells MC. The plural memory cells 61 to 69 are arranged in the X-direction and in the Y-direction in a matrix. The respective memory cells 61 to 69 are arranged at positions where the line patterns 51 to 53 intersect with line patterns 71 to 73 to be described later. An arrangement of the plural memory cells 61 to 69, that is, the memory cell array 10 (refer to FIG. 1) is configured as a so-called cross point type memory.

The second conductive layer 70 is arranged on the memory layer 60. The second conductive layer 70 is formed of a material, which is resistant to heat as well as has a low (electrical) resistance value, for example, a conductor such as metal and the like. The second conductive layer 70 is composed of, for example, tungsten (W), titanium (Ti), tantalum (Ta), and nitrides thereof, layered structures thereof, or the like.

The second conductive layer 70 includes the plural line patterns 71 to 73. The respective line patterns 71 to 73 function as the bit lines BL. The plural line patterns 71 to 73 are arranged in the X-direction at a predetermined pitch. The respective line patterns 71 to 73 extend in the Y-direction.

Figure 3A:
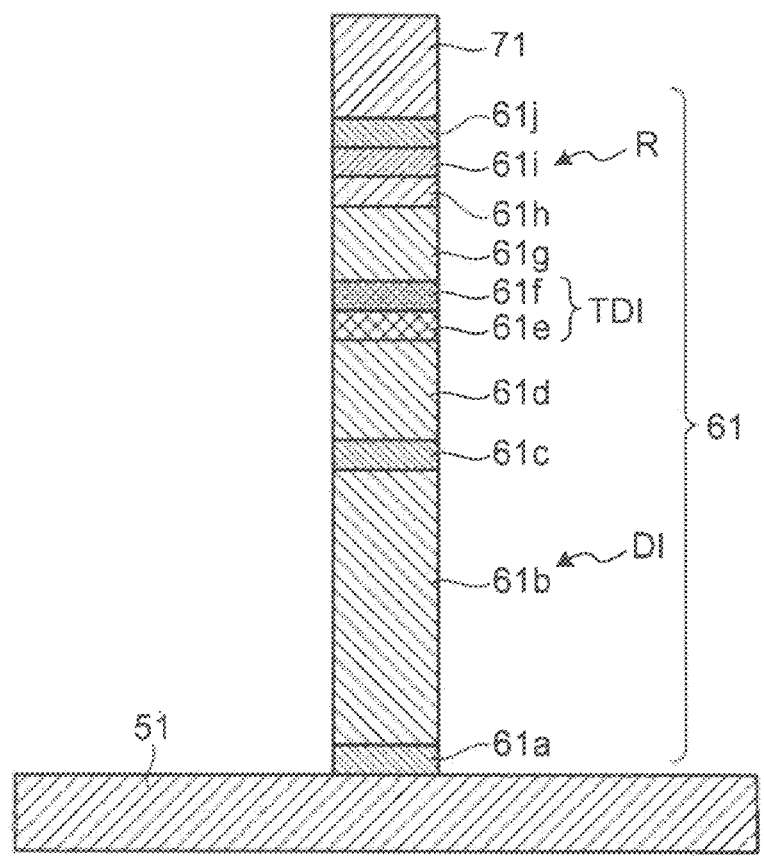
FIGS. 3A and 3B are views showing a configuration of a non-volatile memory cell in the first embodiment.
Figure 3B:
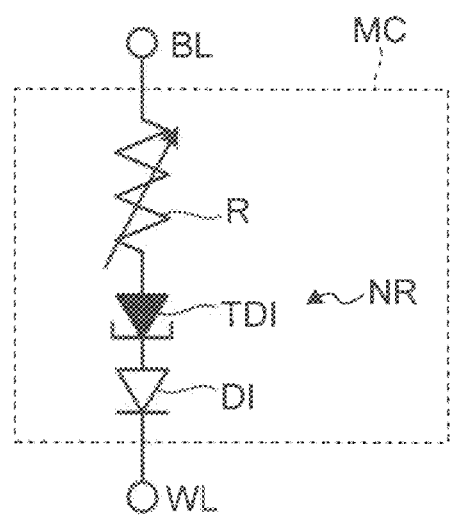

Layer configurations within the respective memory cells 61 to 69 will be explained referring to FIG. 3A and FIG. 3B. FIG. 3A is a view showing the layer configuration in the memory cell 61 in the first embodiment. FIG. 3B is a view showing an equivalent circuit of the memory cell 61 (i.e. a non-volatile memory cells MC). Although FIG. 3A will mainly explain the configuration in the memory cell 61, the configurations of the other memory cells 62 to 69 are the same as the above configuration. Note that the configuration in the memory layer 60 corresponds to the layer configurations, in the respective memory cells 61 to 69.

The memory cell 61 has an electrode layer 61a, a diode layer 61b, an electrode layer 61c, a buffer layer (first buffer portion) 61d, a semiconductor layer 61e, a semiconductor layer 61f, a buffer layer (second buffer portion) 61g, an electrode layer 61h, a variable resistance layer 61i, and an electrode layer 61j.

The electrode layer 61a is arranged on the line pattern 51. The electrode layer 61a is formed of a conductor, for example, metal and the like.

The diode layer 61b is arranged on the electrode layer 61a. The diode layer 61b is composed of, for example, an MIM (Metal/Insulator/Metal) structure, a P+poly-Silicon/Intrinsic–Silicon/N+poly-Silicon (PIN structure), and the like. When the diode layer 61b has the PIN structure, the diode layer 61b has such a configuration that, for example, an N-type layer, an I-type layer, and a P-type layer are sequentially stacked. The N-type layer is formed of a semiconductor (for example, silicon) containing N-type dopants such as arsenide and phosphorus. The I-type layer is formed of a so-called intrinsic semiconductor (for example, silicon) which does not substantially contain dopants. It means that the carrier density of the I-type layer is an order of $10^{-10}$ cm$^{-3}$. The P-type layer is formed of a semiconductor (for example, silicon) containing P-type dopants such as boron. The diode layer 61b functions as the diode DI in each non-volatile memory cell MC (refer to FIG. 3B).

The electrode layer (first buffer portion) 61c is arranged on the diode layer 61b. The electrode layer 61c is formed of a conductor, for example, metal and the like.

The buffer layer (first buffer portion) 61d is arranged on the electrode layer 61c. The crystal structure of buffer layer 61d is similar to that of the semiconductor layer 61e, and more preferably is the same as that of the semiconductor layer 61e (for example, the buffer layer 61d has an interatomic distance in a direction along a surface closer to an interatomic distance of the semiconductor layer 61e). The buffer layer 61d is formed of, for example, a semiconductor such as silicon. The buffer layer 61d has a function for buffering a difference of crystal structures (difference of the interatomic distances and the like) between the electrode layer 61c and the semiconductor layer 61e and buffering a stress caused by such differences. A crystallinity of the semiconductor layer 61e can be improved by these effects. The buffer layer 61d has a thickness necessary to prevent dopants contained in the semiconductor layer 61e from diffusing up to the electrode layer 61c and to prevent elements of the electrode layer 61c from diffusing up to the semiconductor layer 61e and the like inversely.

The semiconductor layer 61e is arranged on the buffer layer 61d. The semiconductor layer 61e is formed of, for example, a semiconductor such as silicon. The semiconductor layer 61e contains N-type dopants such as arsenide and phosphorus. The semiconductor layer 61e contains N-type dopants in a concentration higher than the N-type layer in the diode layer 61b.

The semiconductor layer 61f is arranged on the semiconductor layer 61e. The semiconductor layer 61f is formed of, for example, a semiconductor such as silicon. The semiconductor layer 61f contains P-type dopants such as boron. The semiconductor layer 61f contains P-type dopants in a higher concentration than the P-type layer in the diode layer 61b. The semiconductor layer 61e and the semiconductor layer 61f function as the tunnel diode TDI included in the negative resistance element NR in the non-volatile memory cell MC (refer to FIG. 3B).

The buffer layer (second buffer portion) 61g is arranged on the semiconductor layer 61f. The crystal structure of buffer layer 61g is similar to that of semiconductor layer 61f, and more preferably is the same crystal structure as that of the semiconductor layer 61f (for example, the buffer layer 61g has an interatomic distance in a direction along a surface closer to an interatomic distance of the semiconductor layer 61f). The buffer layer 61g is formed of, for example, a semiconductor such as silicon. The buffer layer 61g has a function for buffering a difference of crystal structures (difference of the interatomic distances and the like) between the electrode layer 61f and the electrode layer 61h and buffering a stress caused by such differences. A crystallinity of the semiconductor layer 61f can be improved by these effects. The buffer layer 61g has a thickness necessary to prevent dopants contained in the semiconductor layer 61f from diffusing up to the electrode layer 61h, and to prevent elements of the electrode layer 61h from diffusing up to the semiconductor layer 61f and the like, inversely as well as to prevent predetermined substances contained in the variable resistance layer 61i from diffusing up to the semiconductor layer 61f. A buffer layer to be described below has the similar role to that of the function described above.

The electrode layer (second buffer portion) 61h is arranged on the buffer layer 61g. The electrode layer 61h is formed of a conductor, for example, metal and the like.

The variable resistance layer 61i is arranged on the electrode layer 61h. The variable resistance layer 61i functions as the variable resistance element R in the non-volatile memory cell MC. The variable resistance layer 61i is formed of a material shown in, for example, Table 1 or Table 2 to be described later.

The electrode layer 61j is arranged on the variable resistance layer 61i. The electrode layer 61j is formed of a conductor, for example, metal and the like.

A tentative case that the memory cell 61 does not have the buffer layer 61d and the buffer layer 61g will be examined here. In the case, since the semiconductor layer 61e is formed on the electrode layer 61c having a greatly different crystal structure (for example, having a greatly different interatomic distance), it becomes difficult to improve the crystallinity of the semiconductor layer 61e. Thus, it becomes also difficult to improve the crystallinity of the semiconductor layer 61f formed on the semiconductor layer 61e. As a result, there is a possibility that the properties (in particular, negative resistance properties) of the semiconductor layer 61e and the semiconductor layer 61f as the tunnel diode TDI are deteriorated.

Further, there is a possibility that the N-type dopants contained in the semiconductor layer 61e are diffused up to the electrode layer 61c and deteriorate the properties of the electrode layer 61c as an electrode. Likewise, there is a possibility that the P-type dopants contained in the semiconductor layer 61f are diffused up to the electrode layer 61h and deteriorate the properties of the electrode layer 61h as an electrode.

In contrast, in the first embodiment, the memory cell 61 has the buffer layer 61d and the buffer layer 61g. More specifically, the buffer layer (first buffer portion) 61d is connected to one end (e.g. lower terminal) of the tunnel diode (negative resistance element) TDI, and the buffer layer (second buffer portion) 61g is connected to the other end (e.g. upper terminal) of the tunnel diode (negative resistance element) TDI. In the case, since the semiconductor layer 61e in the tunnel diode TDI is formed on the buffer layer 61d whose crystal structure (for example, the interatomic distance) is closer to that of the buffer layer 61d, the crystallinity of the semiconductor layer 61e can be easily improved. With these configurations, it becomes also easy to improve the crystallinity of the semiconductor layer 61f formed on the semiconductor layer 61e. As a result, the properties (in particular, negative resistance properties) of the semiconductor layer 61e and the semiconductor layer 61f as the tunnel diodes TDI can be easily improved.

Further, in the first embodiment, the buffer layer 61d has a thickness necessary to prevent the dopants contained in the semiconductor layer 61e from diffusing up to the electrode layer 61c. With such configurations, since the dopants contained in the semiconductor layer 61e are difficult to diffuse up to the electrode layer 61c, a deterioration of the properties of the electrode layer 61c as the electrode can be suppressed. Likewise, the buffer layer 61g has a thickness necessary to prevent the dopants contained the semiconductor layer 61f from diffusing up to the electrode layer 61h. With such configurations, since the dopants contained in the semiconductor layer 61f are difficult to diffuse up to the electrode layer 61h, a deterioration of the characteristics of the electrode layer 61h as the electrode can be suppressed.

As described above, according to the first embodiment, in each non-volatile memory cell MC, the negative resistance element NR is configured such that when a predetermined voltage is applied to the negative resistance element NR, the negative resistance element NR can exhibit a negative resistance. Accordingly, an increase of a voltage in a certain voltage region applied to both ends of the negative resistance element NR reduces a current flowing through the variable resistance element R. When an operating point of a device is appropriately established, an increase of a current flowing through the variable resistance element R can be suppressed when a voltage equal to or larger than the withstanding voltage of the variable resistance element R or an unexpectedly large current tends to be applied. As a result, a (partial) breakdown of the variable resistance element R can be suppressed and a malfunction of the non-volatile memory cell MC can be suppressed.

Further, since the negative resistance element NR includes the tunnel diode TDI, an element, which exhibits a negative resistance by a simple configuration, that is, by a two-layered structure of the semiconductor layer 61e and the semiconductor layer 61f, can be realized.

Note that the connection order of the diode DI, the variable resistance element R, and the negative resistance element NR in the non-volatile memory cell MC may be different from that of FIG. 3B as long as they are connected in series to each other. For example, in the non-volatile memory cell MC, the tunnel diode TDI of the negative resistance element NR may be connected between a bit line BL and the variable resistance element R as shown in FIG. 4A and may be connected between the diode DI and a word line WL as shown in FIG. 4B.

Further, as described above, the tunnel diode TDI is an element having a role different from that of the element selection diode DI, and different current-voltage properties are demanded from the tunnel diode TDI. Therefore, the one diode DI cannot function both as the element selection diode DI and as the element protection tunnel diode TDI at the same time. In other words, although the tunnel diode TDI has a region in which a negative resistance appears when a predetermined voltage is applied in a forward direction, the element selection diode DI does not have a region in which the negative resistance appears. Further, a leak current when a voltage is applied to the tunnel diode TDI in a reverse direction is extraordinarily larger than a leak current when a voltage is applied to the element selection diode DI in the reverse direction. Therefore, the one tunnel diode TDI cannot function both as the diode DI for element selection and as the tunnel diode TDI for element protection at the same time.

Further, a non-volatile semiconductor memory device 1i may have a layer configuration shown in, for example, FIG. 5. FIG. 5 is a view showing an example of a schematic layer configuration in the non-volatile semiconductor memory device in a modification of the first embodiment. A portion different from the layer configuration shown in FIG. 2 will be explained below.

The non-volatile semiconductor memory device 1i includes a second memory layer 80i and a third conductive layer 90i.

The second memory layer 80i is interposed between a second conductive layer 70 and the third conductive layer 90i. A configuration in the second memory layer 80i is similar to the configuration in the memory layer 60.

The second memory layer 80i includes plural memory cells 81i to 89i. The respective memory cells 81i to 89i function as non-volatile memory cells MC. The plural memory cells 81i to 89i are arranged in the X-direction and in the Y-direction in a matrix. The respective memory cells 81i to 89i are arranged at positions where line patterns 71 to 73 intersect with line patterns 91i to 93i to be described later. An arrangement of the plural memory cells 811 to 89i is configured as a so-called cross point type memory. More specifically, a memory cell array 10 (refer to FIG. 1) includes an arrangement of plural memory cells 61 to 69 and an arrangement of the plural memory cells 81i to 89i. In other words, in the memory cell array 10, the plural non-volatile memory cells MC are arranged also in a Z-direction in addition to the X-direction and the Y-direction.

The third conductive layer 90i is arranged on the second memory layer 80i. The third conductive layer 90i is formed of a material, which is resistant to heat as well as has a low (electrical) resistance value, for example, a conductor such as metal and the like. The third conductive layer 90i is composed of, for example, tungsten (W), titanium (Ti), tantalum (Ta), and nitrides thereof, layered structures thereof, or the like.

The third conductive layer 90i includes plural line patterns 91i to 93i. The respective line patterns 91i to 93i function as word lines WL. The plural line patterns 91i to 93i are arranged in the Y-direction at a predetermined pitch. The respective line patterns 91i to 93i extend in the X-direction.

Second Embodiment

Figure 6A:
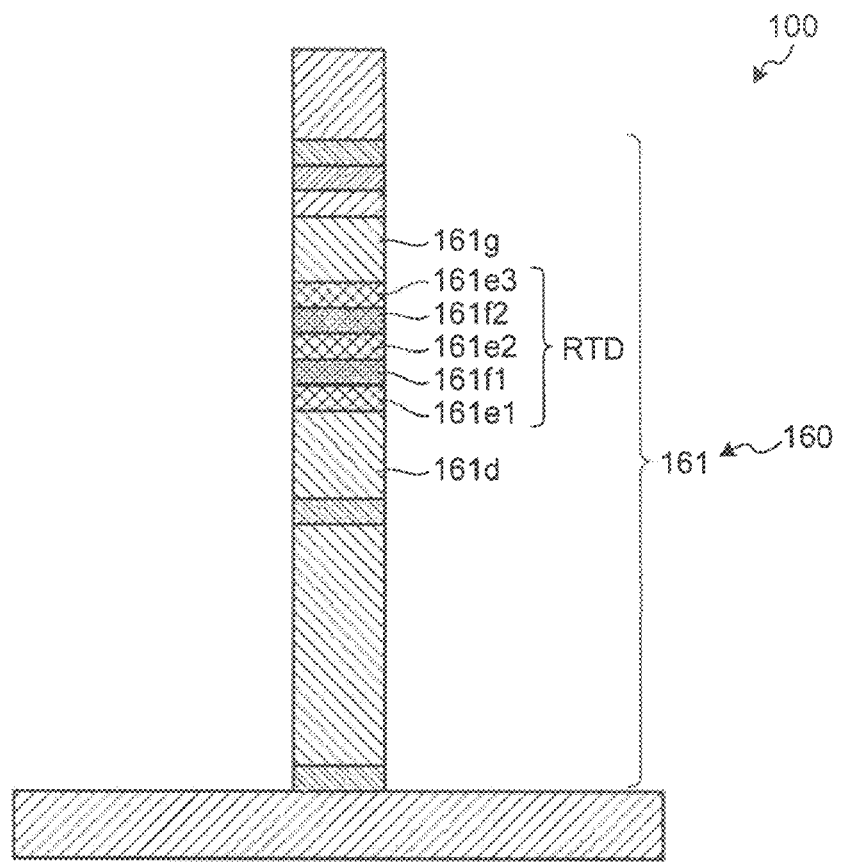
FIGS. 6A and 6B are views showing a configuration of a non-volatile memory cell in a second embodiment.
Figure 6B:
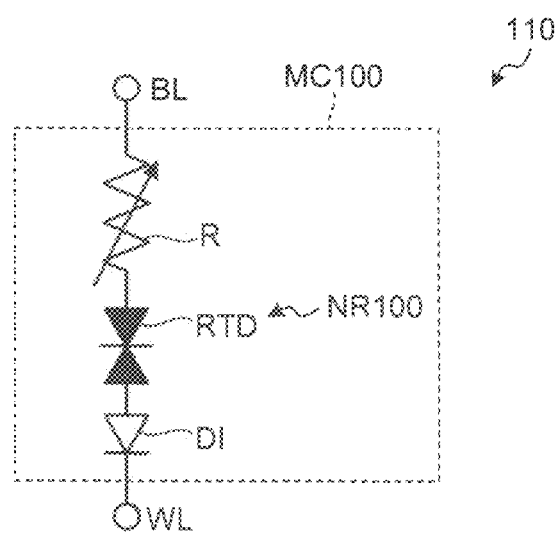

A non-volatile semiconductor memory device 100 according to a second embodiment will be explained using FIG. 6A and FIG. 6B. FIG. 6A is a view showing a layer configuration in a memory cell 161 in the second embodiment. FIG. 6B is a view showing an equivalent circuit of the memory cell 161 (non-volatile memory cell MC100). Portions different from the first embodiment will be mainly explained below.

The non-volatile semiconductor memory device 100 has a memory cell array 110. In the memory cell array 110, plural non-volatile memory cells MC100 are arranged at least in a matrix (in an X-direction and in a Y-direction) (refer to FIG. 1, FIG. 2).

Figure 7B:
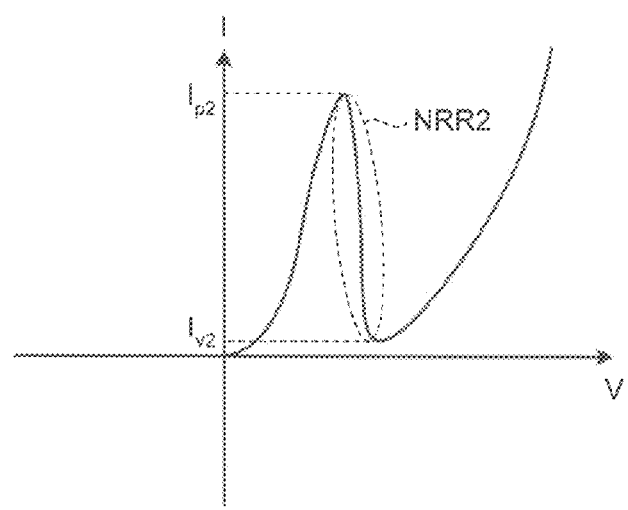
Figure 7C:
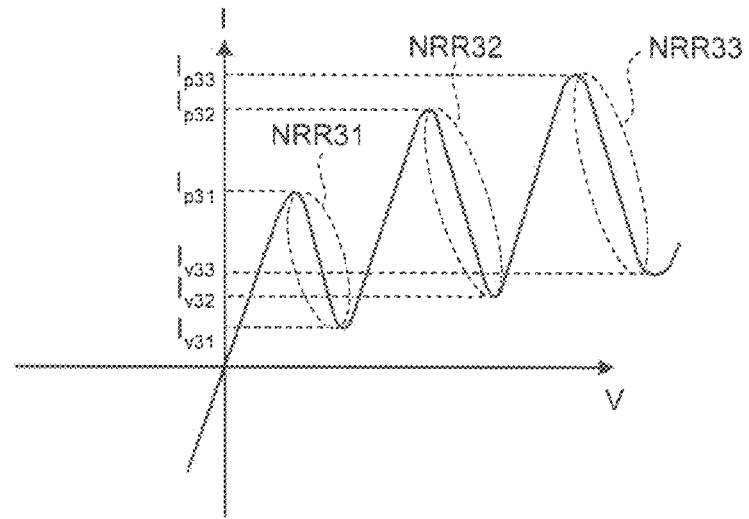

Each of the non-volatile memory cells MC100 has a negative resistance element NR100. The negative resistance element NR100 includes, for example, a resonant tunnel diode (called also a resonant tunnel element) RTD (refer to FIG. 6B). A resonant tunnel diode RTD of the negative resistance element NR100 is designed such that when the resonant tunnel diode RTD is of a single barrier type (having one potential barrier layer), the resonant tunnel diode RTD operates in a negative resistance region NRR2 when a large voltage is applied to a variable resistance element R (for example, when the variable resistance element R is the forming or set) (refer to FIG. 7B). Otherwise, the resonant tunnel diode RTD is designed such that when the resonant tunnel diode RTD is of a multi-barrier type (having plural potential barrier layers), the resonant tunnel diode RTD operates in any of negative resistance regions NRR31 to NRR33 when a large voltage is applied to the variable resistance element R (for example, when the variable resistance element R is the forming or set) (refer to FIG. 7C).

Negative resistance properties of the resonant tunnel diode RTD (refer to FIGS. 7B, 7C) become more drastic than the negative resistance properties of the tunnel diode DI in the first embodiment (refer to FIG. 7A). More specifically, a current reduction rate of the resonant tunnel diode RTD when a voltage is applied to both ends of the resonant tunnel diode RTD increases is larger and more steep than that of the tunnel diode DI. Further, a peak-valley ratio of a current in negative resistance properties of the resonant tunnel diode RTD is larger than a peak-valley ratio of a current in the negative resistance properties of the tunnel diode DI. This will be shown by the follow expressions.

$$I_{p2}/I_{v2} > I_{p1}/I_{v1}$$

$$I_{p31}/I_{v31} > I_{p1}/I_{v1}$$

$$I_{p32}/I_{v32} > I_{p1}/I_{v1}$$

$$I_{p33}/I_{v33} > I_{p1}/I_{v1}$$

As a result, a current flowing through the variable resistance element R can be steeply restricted.

Further, with respect to a layer configuration, the non-volatile semiconductor memory device 100 has a memory layer 160. The memory layer 160 includes plural memory cells. Each of the memory cells (for example, a memory cell 161) has a layer configuration different from that of the first embodiment.

More specifically, as shown in FIG. 6A, the memory cell has a buffer layer (first buffer portion) 161d, a semiconductor layer (first layer) 161e1, a semiconductor layer (second layer) 161f1, a semiconductor layer (first layer) 161e2, a semiconductor layer (second layer) 161f2, a semiconductor layer (first layer) 161e3, and a buffer layer (second buffer portion) 161g.

The crystal structure of buffer layer (first buffer portion) 161d is similar to that of the semiconductor layer 161e1 (for example, the buffer layer 161d has an interatomic distance in a direction along a surface closer to an interatomic distance of the semiconductor layer 161e1). The buffer layer 161d is formed of, for example, a semiconductor such as silicon. The buffer layer (first buffer portion) 161d has a role for easily improving the crystallinities of the semiconductor layer 161e1 and layers on the semiconductor layer 161e1 and relaxing or controlling the stress of the semiconductor layer 161e1. In the resonant tunnel diode RTD, a crystallinity of a film greatly influences its properties. In particular, in a structure stacked with other elements, since various problems such as an improvement of a crystallinity, a control of film stress, prevention of diffusion of dopants, and the like can possibly occur, it is difficult to operate a simply designed structure as it is. Thus, there are many problems that is to be solved.

The semiconductor layer 161e1 is arranged on the buffer layer 161d. The semiconductor layer 161e1 (first layer) is formed of a first material selected from a group composed of SiGe, Si, CaF, CdF, SiO$_2$, SiN, Al$_2$O$_3$, GaAs, AlGaAs, AlAs, InAs, InSb, AlSb, GaSb. The first material is, for example, Si (silicon).

The semiconductor layer (second layer) 161f1 is arranged on the semiconductor layer (first layer) 161e1. The semiconductor layer (second layer) 161f1 is formed of a second material selected from the above group. The second material is, for example, SiGe (silicon germanium).

The semiconductor layer (first layer) 161e2 is arranged on the semiconductor layer (second layer) 161f1. The semiconductor layer (first layer) 161e2 is formed of the first material selected from the above group. The first material is, for example, Si (silicon).

The semiconductor layer (second layer) 161f2 is arranged on the semiconductor layer (first layer) 161e2. The semiconductor layer (second layer) 161f2 is formed of the second material selected from the above group. The second material is, for example, SiGe (silicon germanium).

The semiconductor layer (first layer) 161e3 is arranged on the semiconductor layer (second layer) 161f2. The semiconductor layer (first layer) 161e3 is formed of the first material selected from the above group. The first material is, for example, Si (silicon).

The crystal structure of buffer layer (second buffer portion) 161g is similar to that of the semiconductor layer 161e3 (for example, the buffer layer 161g has an interatomic distance in a direction along a surface closer to an interatomic distance the semiconductor layer 161e3). The buffer layer 161g is formed of, for example, a semiconductor such as silicon.

As described above, the resonant tunnel diode RTD has a layered structure in which, for example, a Si layer (first layer) and a SiGe layer (second layer) are alternately and repeatedly stacked. More specifically, since a band gap of the first material (for example, a value of 1.1 eV when the first material is Si) is larger than a band gap of the second material (for example, when the second material is SiGe, a value smaller than 1.1 eV and larger than 0.66 eV), a quantum well layer (first layer) and a potential barrier layer (second layer) are alternately and repeatedly stacked in the resonant tunnel diode RTD. More specifically, the resonant tunnel diode RTD includes at least one unit structure in which one potential barrier layer (second layer) is sandwiched between two quantum well layers (first layers). When the resonant tunnel diode RTD includes one unit structure and one potential barrier layer, it is called a single barrier type RTD, when the resonant tunnel diode RTD includes two unit structures and two potential barrier layers, it is called a double barrier type RTD, and when the resonant tunnel diode RTD includes three unit structures and three potential barrier layers, it is called a triple barrier type RTD. Since the resonant tunnel diode RTD has a larger degree of freedom of element design as compared with the tunnel diode TD in the first embodiment, the resonant tunnel diode RTD can be applied to a wider range.

Note that a composition and a combination can be selected by selecting a necessary potential barrier and the like from the above groups. A dopant can be appropriately selected and used when necessary. A film thickness of a quantum well layer, a height of a potential barrier formed of the potential barrier layer, a crystallinity, and the like are important together with an element configuration. In general, it is necessary to control stress relaxation, lattice matching, and the like as a substrate for constructing an element, and further it is preferable to form a so-called buffer layer after the element is formed.

Further, as another structure, it is also possible to form a quantum well layer of metal fine particles or semiconductor fine particles having a particle diameter of a nano-level order and to form a potential barrier layer of a silicon oxide film or a silicon nitride film. More specifically, in the resonant tunnel diode RTD, a quantum well layer, which is formed of metal or semiconductor nano particles, and a potential barrier layer formed of silicon oxides or silicon nitrides may be alternately (for example, repeatedly) layered.

Outline of Working Examples

Working examples, in which several samples are made and a resistance difference between a reset (erase) state and a set (write) state is evaluated will be explained. It should be noted that, since set/reset is an exemplary name defined to be called, the set/reset may be defined otherwise.

Figure 8:
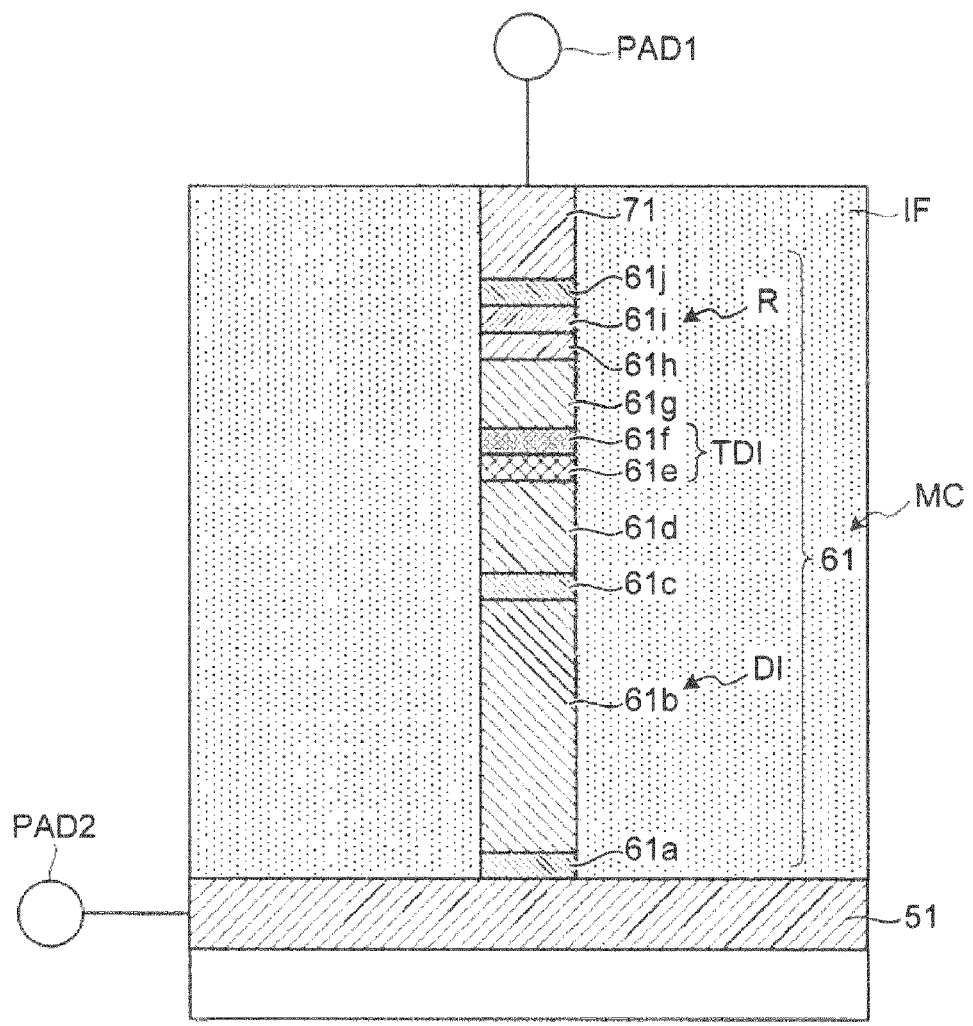
FIG. 8 is a view explaining a working example.

As the samples, for example, a resistance change type non-volatile memory cell having a buried type structure shown in FIG. 2 is used in addition to a pillar type cross point array structure shown in FIG. 8. A result of evaluation of the samples for switching properties having the structure shown in FIG. 8 will be explained below.

The non-volatile memory cell shown in FIG. 8 is of a buried-type structure in which a hole is formed to an interlayer insulation film IF arranged on a semiconductor substrate 40 and materials to be stacked similar to those of FIG. 3A are sequentially buried into the hole. Since a layer configuration formed by burying the layer materials into the hole is similar to the structure shown in FIG. 3A, the layer structure is shown using similar component numbers as those of FIG. 3A. Further, an electrode pad PAD1 is connected to a line pattern 71, and an electrode pad PAD2 is connected to a line pattern 51. A structure, in which a so-called pillar stands, has theoretically a similar configuration.

A variable resistance layer 61i is mainly composed of carbon or of carbon and silicon (Si). A composition example of the variable resistance layer 61i mainly composed of carbon is as shown in Table 1. ICP, XPS, RBS, HFS, SIMS, TOF-SIMS and the like are used for a composition analysis.

TABLE 1

| COMPOSITION EXAMPLE OF VARIABLE RESISTANCE LAYER 61i MAINLY COMPOSED OF CARBON | | |
|---|---|---|
| No. | C [at. %] | H [at. %] |
| 1 | 50 | 50 |
| 2 | 85 | 15 |
| 3 | 70 | 30 |
| 4 | 35 | 65 |
| 5 | 90 | 10 |

In an evaluation for switching properties, a probe pair having an acute extreme end of a diameter of 10 nm or less is caused to come into contact with electrode pads PAD1, PAD2 having a diameter of about 100 μmφ as samples. Data is written and erased using one of the probe pairs.

Data is written by applying a voltage pulse of 1 to 15 V to the non-volatile memory cell MC (memory cell 61) in a pulse width of, for example, 10 nsec to 100 msec. Data is erased by applying a voltage pulse of 0.2 to 15 V to the non-volatile memory cell MC (memory cell 61) in a width of, for example, 10 nsec to 100 μsec. The pulse widths in the write and the erase have different optimum values depending on a material and a structure of the samples. Further, the pulse widths may somewhat different depending on the number of times of switching, and optimized conditions are used as properties to be measured. Note that an evaluation by means of DC is also possible as in a case performed using a semiconductor parameter analyzer.

Further, data is read using the other of the probe pairs while data is written or erased. Data is read by applying a voltage pulse having a width 10 to 1000 nsec and about 0.1 to 0.5 V to the non-volatile memory cell MC (memory cell 61) and measuring a resistance value, a current, a voltage, and the like of the variable resistance layer (record bit) 61$i$. An accompanying circuit such as a protection resistor circuit and the like also can be used as necessary.

First Working Example

In a memory cell 61 according to the first working example, a variable resistance layer 61$i$ was made using plasma CVD, and a film composed of silicon (Si), carbon (C), and hydrogen (H) was applied. In addition to the CVD, sputtering and the like could be used to form the variable resistance layer 61$i$ mainly composed of Si, C, H. When the variable resistance layer 61$i$ was formed, silane ($SiH_4$) gases such as trimethylsilane ($CH_3$)$_3$SiH, dimethylsilane ($CH_3$)$_2$$SiH_2$, and the like and hydrocarbon (CH) gases such as $C_2H_2$, $C_2H_4$, $C_3H_6$ and the like could be used in the CVD. Nitrogen could be contained in the film by adding $N_2$, $NH_3$, and the like. Inert gases such as He, Ar, and the like were used as a carrier gas. Although the film could be formed in a temperature range of about 300° C. to 500° C., there was no problem even if the film was formed at a lower or higher temperature depending on required film properties. When other film deposition conditions, for example, an RF power, a gas flow rate, a gas pressure, a distance between spacers, and the like were not taken into consideration, in general, a film formed at a lower temperature was liable to be made to a film containing a larger amount of hydrogen and having a relatively low density, whereas a film having a lower hydrogen amount and a relatively high density could be easily obtained at a higher temperature on the contrary.

A film of a variable resistance layer is preferably had a composition composed of at least one kind of element selected from carbon (C), Si, hydrogen (H), or carbon (C), Si, hydrogen (H), and nitrogen (N), oxygen (O), and when a composition range of the film was Si. $(C_a N_b O_c)_y H_z$, the range was more preferably $5 \leq x \leq 40$, $20 \leq y \leq 66$, $30 \leq z \leq 65$, $50 \leq a \leq 100$, $0 \leq b \leq 20$, and $0 \leq c \leq 4$. A film, in which a compound having the composition had at least any two kinds of chemical bondings selected from Si—C, —Si—($CH_2$)$_x$, —Si—H—, —C=C—, —$CH_2$—, —Si—NH—Si—, —$NH_x$, —Si—$C_6H_x$, had better switching properties. In the film having the composition, a monolayer film just after deposited had an electric resistivity of $10^4$ Ω·cm or more at 50 to 100 nmt.

Experiments were performed changing process conditions variously, and Table 2 shows an example, in which a composition of a resistance change film was mainly composed of carbon and silicon (Si), was analyzed. Note that, in the composition analysis, ICP, XPS, RBS and the like were used as to Si and C, and HFS, RBS, XPS, SIMS, TOF-SIMS, and the like were used as H, N, O.

TABLE 2

COMPOSITION EXAMPLE OF VARIABLE RESISTANCE LAYER 61i MAINLY COMPOSED OF CARBON AND SILICON (Si) AND EXPERIMENTED CHANGING PROCESS CONDITIONS

| No. | Si [at. %] | C [at. %] | N [at. %] | O [at. %] | H [at. %] | Detected Chemical Bonding States |
|---|---|---|---|---|---|---|
| 1 | 5 | 30 | 0 | 0 | 65 | Si—C, —Si—($CH_3$)$_x$, —Si—H—, —C=C—, —$CH_2$—, —Si—$C_6H_x$ |
| 2 | 23 | 20 | 14 | 0 | 42 | Si—C, —Si—($CH_3$)$_x$, —Si—H—, —C=C—, —$CH_2$—, —Si—NH—Si—, —$NH_x$, —Si—$C_6H_x$ |
| 3 | 30 | 30 | 5 | 0 | 35 | Si—C, —Si—($CH_3$)$_x$, —Si—H—, —C=C—, —$CH_2$—, —Si—NH—Si—, —$NH_x$, —Si—$C_6H_x$ |
| 4 | 21 | 18 | 15 | 0 | 44 | Si—C, —Si—($CH_3$)$_x$, —Si—H—, —C=C—, —$CH_2$—, —Si—NH—Si—, —NHx, —Si—$C_6H_x$ |
| 5 | 32 | 31 | 0 | 2 | 35 | Si—C, —Si—($CH_3$)$_x$, —Si—H—, —C=C—, —$CH_2$—, —Si—$C_6H_x$ |
| 6 | 5 | 60 | 4 | 1 | 30 | Si—C, —Si—($CH_3$)$_x$, —Si—H—, —C=C—, —$CH_2$—, —Si—NH—Si—, —NHx, —Si—$C_6H_x$, Si—O |
| 7 | 11 | 37 | 3 | 0 | 49 | Si—C, —Si—($CH_3$)$_x$, —Si—H—, —C=C—, —$CH_2$—, —Si—NH—Si—, —$NH_x$, —Si—$C_6H_x$ |
| 8 | 17 | 25 | 5 | 2 | 51 | Si—C, —Si—($CH_3$)$_x$, —Si—H—, —C=C—, —$CH_2$—, —Si—NH—Si—, —NHx, —Si—$C_6H_x$, Si—O |
| 9 | 32 | 32 | 1 | 0 | 35 | Si—C, —Si—($CH_3$)$_x$, —Si—H—, —C=C—, —$CH_2$—, —Si—NH—Si—, —NHx, —Si—$C_6H_x$ |
| 10 | 30 | 20 | 0 | 0 | 50 | Si—C, —Si—($CH_3$)$_x$, —Si—H—, —C=C—, —$CH_2$—, —Si—$C_6H_x$ |
| 11 | 21 | 18 | 15 | 0 | 44 | Si—C, —Si—($CH_3$)$_x$, —Si—H—, —C=C—, —$CH_2$—, —Si—NH—Si—, —$NH_x$, —Si—$C_6H_x$ |
| 12 | 30 | 30 | 0 | 1 | 35 | Si—C, —Si—($CH_3$)$_x$, —Si—H—, —C=C—, —$CH_2$—, —Si—$C_6H_x$, Si—O |

Chemical bonding states of the elements in these films could be obtained using XPS, FT-IR, TOF-SIMS, and the like. Table 2 shows also the chemical bonding states.

The variable resistance layer 61$i$ had a diameter φ of 0.05 μm and a height H of 7 nm. A line pattern 51 and a line pattern 71 were formed of W (tungsten). A tunnel diode TDI as a negative resistance element NR for protecting a variable resistance element R or restricting a current applied to the resistance element R had respective layers (a semiconductor layer 61$e$ and a semiconductor layer 61$f$) formed by more increasing a dopant amount than that in an ordinary Si PN junction diode. Buffer layers (a buffer layer 61$d$ and a buffer layer 61$g$) formed of Si were arranged on and under the tunnel diode TDI.

In the first working example, as a result of evaluation of switching characteristics, a resistance value in a reset state (high resistance state) was an order of $10^7\Omega$, and a resistance value in a set state (low resistance state) was an order of $10^4\Omega$. Although a voltage 1.5 times or 2 times as high as an optimum voltage in the set/reset was applied, no malfunction occurred as well as no (partial) breakdown of the variable resistance element R (variable resistance layer 61$i$) was observed thereafter. Further, an operation of 1000 cycles or more was possible as a cycle life without problem. Further, a resistance value in the set state (low resistance state) was an order of $10^4\Omega$, a cell current (a current read from the non-volatile memory cell) was suppressed to an appropriate range, and power consumption was also suppressed. Accordingly, a probability of erroneous switching was suppressed low as well as the variable resistance element R could be protected and an operation could be performed at low power consumption.

Second Working Example

In the configuration similar to the first working example (refer to FIG. 8), a variable resistance layer 61$i$ was made using plasma CVD, and a film composed of carbon (C) and hydrogen (H) was applied. The variable resistance layer 61$i$ could be formed using sputtering and the like in addition to the CVD. When the variable resistance layer 61$i$ was formed, hydrocarbon (CH) gases of $C_2H_2$, $C_2H_4$, $C_3H_6$, and the like could be used as a reaction gas in the CVD. Inert gases such as He, Ar, and the like were used as a carrier gas. A film could be formed in a temperature range from about 300° C. to 500° C.

The variable resistance layer 61$i$ had a diameter φ of 0.05 μm and a height H of 10 nm. A line pattern 51 was formed of W (tungsten), and a line pattern 71 was formed of TiN. A tunnel diode TDI (a semiconductor layer 61$e$ and a semiconductor layer 61$f$) were used as a negative resistance element NR for protecting a variable resistance element R or restricting a current applied to the variable resistance element R. Buffer layers (a buffer layer 61$d$ and a buffer layer 61$g$) formed of Si were arranged on and under the tunnel diode TDI.

As a result of evaluation of switching properties, a resistance value in a reset state (high resistance state) was an order of $10^6\Omega$, and a resistance value in a set state (low resistance state) was an order of $10^3\Omega$. Although a voltage 1.5 times or 2 times as high as an optimum voltage in the set/reset was applied, no malfunction occurred as well as no (partial) breakdown of the variable resistance element R (variable resistance layer 61$i$) was observed thereafter. Further, an operation of 1000 cycles or more was possible as a cycle life without problem. Further, a resistance value in the set state (low resistance state) was an order of $10^4\Omega$, a cell current (a current read from the non-volatile memory cell) was suppressed to an appropriate range, and power consumption was also suppressed. Accordingly, a probability of erroneous switching was suppressed low as well as the variable resistance element R could be protected and an operation could be performed at low power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a first line;
   a second line intersecting with the first line; and
   a memory cell arranged at a position where the second line intersects with the first line;
   wherein, the memory cell includes:
      a variable resistance element;
      a negative resistance element connected in series to the variable resistance element;
      a first buffer portion connected to one end of the negative resistance element; and
      a second buffer portion connected to the other end of the negative resistance element;
   the negative resistance element includes:
      a first semiconductor layer constituting the one end; and
      a second semiconductor layer constituting the other end;
   the first buffer portion includes:
      a first buffer layer in contact with the first semiconductor layer; and
      a first electrode layer in contact with a surface of the first buffer layer opposite to a surface in contact with the first semiconductor layer; and
   the second buffer portion includes:
      a second buffer layer in contact with the second semiconductor layer; and
      a second electrode layer in contact with a surface of the second buffer layer opposite to a surface in contact with the second semiconductor layer; and wherein
   an interatomic distance of the first buffer layer in a direction along a contact surface to the first semiconductor layer is closer to an interatomic distance of the first semiconductor layer in the direction along the contact surface than an interatomic distance of the first electrode layer in the direction along the contact surface; and
   an interatomic distance of the second buffer layer in a direction along a contact surface to the second semiconductor layer is closer to an interatomic distance of the second semiconductor layer in the direction along the contact surface than an interatomic distance of the second electrode layer in the direction along the contact surface.

2. The non-volatile semiconductor memory device according to claim 1, wherein
   the memory cell further comprises a rectifier element connected in series to the variable resistance element and the negative resistance element.

3. The non-volatile semiconductor memory device according to claim 2, wherein:
   the rectifier element includes a diode; and
   the negative resistance element includes a tunnel diode.

4. The non-volatile semiconductor memory device according to claim 3, wherein
   the diode includes a PIN structure.

5. The non-volatile semiconductor memory device according to claim 2, wherein
   the rectifier element includes a diode, and
   the negative resistance element includes a resonance tunnel diode.

6. The non-volatile semiconductor memory device according to claim 5, wherein
   in the resonance tunnel diode a first layer and a second layer are alternately stacked, the first layer being formed of a first material selected from a group composed of SiGe, Si, CaF, CdF, SiO$_2$, SiN, Al$_2$O$_3$, GaAs, AlGaAs, AlAs, InAs, InSb, AlSb, GaSb, and the second layer being formed of a second material selected from the group.

7. The non-volatile semiconductor memory device according to claim 6, wherein
a band gap of the first material is larger than a band gap of the second material.

8. A non-volatile semiconductor memory device comprising:
a first line;
a second line intersecting with the first line; and
a memory cell arranged at a position where the second line intersects with the first line;
wherein, the memory cell includes:
a variable resistance element;
a negative resistance element connected in series to the variable resistance element;
a first buffer portion connected to one end of the negative resistance element; and
a second buffer portion connected to the other end of the negative resistance element;
the negative resistance element includes:
a first semiconductor layer constituting the one end; and
a second semiconductor layer constituting the other end;
the first buffer portion includes:
a first buffer layer in contact with the first semiconductor layer; and
a first electrode layer in contact with a surface of the first buffer layer opposite to a surface in contact with the first semiconductor layer; and
the second buffer portion includes:
a second buffer layer in contact with the second semiconductor layer; and
a second electrode layer in contact with a surface of the second buffer layer opposite to a surface in contact with the second semiconductor layer; and wherein
the first semiconductor layer and the second semiconductor layer contain dopants, respectively,
the first buffer layer has a thickness sufficient to prevent the dopants contained in the first semiconductor layer from diffusing up to the first electrode layer; and
the second buffer layer has a thickness sufficient to prevent the dopants contained in the second semiconductor layer from diffusing up to the second electrode layer.

9. The non-volatile semiconductor memory device according to claim 8, wherein
the memory cell further comprises a rectifier element connected in series to the variable resistance element and the negative resistance element.

10. The non-volatile semiconductor memory device according to claim 9, wherein:
the rectifier element includes a diode; and
the negative resistance element includes a tunnel diode.

11. The non-volatile semiconductor memory device according to claim 10, wherein
the diode includes a PIN structure.

12. The non-volatile semiconductor memory device according to claim 9, wherein
the rectifier element includes a diode, and
the negative resistance element includes a resonance tunnel diode.

13. The non-volatile semiconductor memory device according to claim 12, wherein
in the resonance tunnel diode a first layer and a second layer are alternately stacked, the first layer being formed of a first material selected from a group composed of SiGe, Si, CaF, CdF, SiO$_2$, SiN, Al$_2$O$_3$, GaAs, AlGaAs, AlAs, InAs, InSb, AlSb, GaSb, and the second layer being formed of a second material selected from the group.

14. The non-volatile semiconductor memory device according to claim 13, wherein
a band gap of the first material is larger than a band gap of the second material.

15. A non-volatile semiconductor memory device comprising:
a first line;
a second line intersecting with the first line; and
a memory cell arranged at a position where the second line intersects with the first line;
wherein, the memory cell includes:
a variable resistance element;
a negative resistance element connected in series to the variable resistance element;
a first buffer portion connected to one end of the negative resistance element; and
a second buffer portion connected to the other end of the negative resistance element;
the negative resistance element includes:
a first semiconductor layer constituting the one end; and
a second semiconductor layer constituting the other end;
the first buffer portion includes:
a first buffer layer in contact with the first semiconductor layer; and
a first electrode layer in contact with a surface of the first buffer layer opposite to a surface in contact with the first semiconductor layer; and
the second buffer portion includes:
a second buffer layer in contact with the second semiconductor layer; and
a second electrode layer in contact with a surface of the second buffer layer opposite to a surface in contact with the second semiconductor layer; and wherein
the first buffer layer has a thickness sufficient to prevent elements of the first electrode layer from diffusing up to the first semiconductor layer; and
the second buffer layer has a thickness sufficient to prevent elements of the second electrode layer from diffusing up to the second semiconductor layer.

16. The non-volatile semiconductor memory device according to claim 15, wherein
the memory cell further comprises a rectifier element connected in series to the variable resistance element and the negative resistance element.

17. The non-volatile semiconductor memory device according to claim 16, wherein:
the rectifier element includes a diode; and
the negative resistance element includes a tunnel diode.

18. The non-volatile semiconductor memory device according to claim 17, wherein
the diode includes a PIN structure.

19. The non-volatile semiconductor memory device according to claim 16, wherein
the rectifier element includes a diode, and
the negative resistance element includes a resonance tunnel diode.

20. The non-volatile semiconductor memory device according to claim 19, wherein
in the resonance tunnel diode a first layer and a second layer are alternately stacked, the first layer being formed of a first material selected from a group composed of SiGe, Si, CaF, CdF, SiO$_2$, SiN, Al$_2$O$_3$, GaAs, AlGaAs, AlAs, InAs, InSb, AlSb, GaSb, and the second layer being formed of a second material selected from the group.

* * * * *